(12) United States Patent
Shi

(10) Patent No.: US 10,559,639 B2
(45) Date of Patent: Feb. 11, 2020

(54) ORGANIC LIGHT-EMITTING DISPLAY DEVICE AND METHOD FOR MANUFACTURING THE SAME

(71) Applicant: Shenzhen China Star Optoelectronics Technology Co., Ltd., Shenzhen, Guangdong (CN)

(72) Inventor: Longqiang Shi, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 15/323,796

(22) PCT Filed: Aug. 31, 2016

(86) PCT No.: PCT/CN2016/110325
§ 371 (c)(1),
(2) Date: Jan. 4, 2017

(87) PCT Pub. No.: WO2018/040379
PCT Pub. Date: Mar. 8, 2018

(65) Prior Publication Data
US 2018/0190743 A1 Jul. 5, 2018

(30) Foreign Application Priority Data
Aug. 31, 2016 (CN) .......................... 2016 1 0795991

(51) Int. Cl.
H01L 27/32 (2006.01)
H01L 51/56 (2006.01)
(Continued)

(52) U.S. Cl.
CPC .... *H01L 27/3262* (2013.01); *H01L 29/66969* (2013.01); *H01L 29/7869* (2013.01); *H01L 51/56* (2013.01); *H01L 27/1225* (2013.01)

(58) Field of Classification Search
CPC ............. H01L 27/3262; H01L 27/1225; H01L 29/66969; H01L 29/7869; H01L 21/77; H01L 27/32; H01L 51/56
(Continued)

(56) References Cited

U.S. PATENT DOCUMENTS

2008/0038882 A1* 2/2008 Takechi .............. H01L 29/4908
438/151
2009/0284449 A1* 11/2009 Lee ..................... H01L 27/1225
345/76
(Continued)

FOREIGN PATENT DOCUMENTS

CN 104078486 A 10/2014
CN 104538401 A 4/2015
(Continued)

OTHER PUBLICATIONS

International Search Report and Written Opinion for International Application No. PCT/CN2016/110325, dated Jun. 8, 2017.
(Continued)

Primary Examiner — Dzung Tran

(57) ABSTRACT

Disclosed are an organic light-emitting display device and a method for manufacturing the same. In the organic light-emitting display device, a switching thin film field-effect transistor comprises a first active layer for reducing a sub-threshold swing of a transfer characteristic curve of the switching thin film field-effect transistor; and a driving thin film field-effect transistor comprises a second active layer for increasing a sub-threshold swing of a transfer characteristic curve of the drive film field-effect transistor.

5 Claims, 6 Drawing Sheets

(51) Int. Cl.
*H01L 29/66* (2006.01)
*H01L 29/786* (2006.01)
*H01L 27/12* (2006.01)

(58) Field of Classification Search
USPC .............................................. 257/40, 59, 79
See application file for complete search history.

(56) References Cited

U.S. PATENT DOCUMENTS

| | | | | |
|---|---|---|---|---|
| 2011/0108835 | A1* | 5/2011 | Kim | H01L 29/7869 |
| | | | | 257/43 |
| 2012/0326143 | A1* | 12/2012 | Tsurume | H01L 27/1225 |
| | | | | 257/43 |
| 2013/0293601 | A1 | 11/2013 | Akimoto et al. | |
| 2014/0361292 | A1* | 12/2014 | Yamazaki | H01L 29/7869 |
| | | | | 257/43 |
| 2015/0214248 | A1* | 7/2015 | Chou | H01L 27/1225 |
| | | | | 257/40 |
| 2016/0343737 | A1* | 11/2016 | Zhang | H01L 27/1225 |

FOREIGN PATENT DOCUMENTS

| | | | |
|---|---|---|---|
| CN | 105514118 | * | 4/2016 |
| CN | 105514118 A | | 4/2016 |
| JP | 2009075523 A | | 4/2009 |

OTHER PUBLICATIONS

Chinese Office Action and Search Report for Chinese Patent Application No. 201610795991.6 dated Aug. 29, 2018.

* cited by examiner

ORGANIC LIGHT-EMITTING DISPLAY DEVICE AND METHOD FOR MANUFACTURING THE SAME

The present application claims the priority of Chinese patent application CN201610795991.6, entitled "Organic light-emitting display device and method for manufacturing the same" and filed on Aug. 31, 2016, the entirety of which is incorporated herein by reference.

TECHNICAL FIELD

The present disclosure relates to the technical field of organic light-emitting display, and in particular, to an organic light-emitting display device. The present disclosure further relates to a method for manufacturing the organic light-emitting display device.

TECHNICAL BACKGROUND

Oxide semiconductor thin film field-effect transistors shall be a hot spot in the field of display in the future and have been researched and developed widely in recent years. A 2T1C structure serves as the most basic structure of an active matrix organic light-emitting diode (AMOLED) based on a thin film field-effect transistor and is composed of two thin film field-effect transistors and a storage capacitor Cst arranged between the two thin film field-effect transistors, as shown in FIG. 1.

Mobility of an amorphous indium-gallium-zinc oxide (a-IGZO) film serving as an active channel layer can reach 80 cm2/Vs (while the mobility of amorphous silicon is merely 0.5~0.8 cm2/Vs). Further, the procedure of manufacturing amorphous indium-gallium-zinc oxide (a-IGZO) film is compatible with the procedure of manufacturing amorphous silicon (a-Si). Therefore, indium-gallium-zinc oxide (IGZO) has potential application in the organic light-emitting diode (OLED) of next generation.

In the prior art, an IGZO-TFT (indium-gallium-zinc oxide thin film transistor)-based 2T1C structure comprises a switching thin film field-effect transistor, a driving thin film field-effect transistor, and a storage capacitor connecting the switching thin film field-effect transistor and the driving thin film field-effect transistor. The switching thin film field-effect transistor plays a role of a switch, and the driving thin film field-effect transistor plays a role of a regulating a gray scale of an OLED. Under an ideal condition, different thin film field-effect transistors have different electric requirements. As shown in FIG. 2, an switching thin film field-effect transistor requires a small sub-threshold swing (SS) of a transfer characteristic curve (IdVg curve) thereof, so that the switching thin film field-effect transistor can be switched on/off quickly. As shown in FIG. 3, a driving thin film field-effect transistor requires a large sub-threshold swing of the transfer characteristic curve thereof, so that a gray scale of an OLED can be regulated slowly through the driving thin film field-effect transistor.

However, in the prior art, in a 2T1C structure, the sub-threshold swing of the transfer characteristic curve of the switching thin film field-effect transistor is almost identical with that of the driving thin film field-effect transistor because the structures of the switching thin film field-effect transistor and the driving thin film field-effect transistor are the same. Therefore, the 2T1C structure in the prior art does not have both of the functions of switching on/off the switching thin film field-effect transistor quickly and regulating the gray scale of the OLED slowly through the driving thin film field-effect transistor.

SUMMARY OF THE INVENTION

The present disclosure provides an organic light-emitting display device and a method for manufacturing the same in allusion to the problem that sub-threshold swings of an IdVg curve of two thin film field-effect transistors of an active matrix organic light-emitting diode (AMOLED) in the prior art are almost the same and cannot meet respective electric requirements thereof at the same time.

On one aspect, the present disclosure provides an organic light-emitting display device comprising a switching thin film field-effect transistor, a driving thin film field-effect transistor, and a storage capacitor connecting the switching thin film field-effect transistor and the driving thin film field-effect transistor.

The switching thin film field-effect transistor comprises a first active layer for reducing a sub-threshold swing of a transfer characteristics curve of the switching thin film field-effect transistor.

The driving thin film field-effect transistor comprises a second active layer for increasing a sub-threshold swing of a transfer characteristics curve of the driving thin film field-effect transistor.

Preferably, an oxygen content of the second active layer is greater than that of the first active layer.

Preferably, the first active layer and the second active layer are indium-gallium-zinc oxide layers.

Preferably, the switching thin film field-effect transistor also comprises a third active layer which is formed on the first active layer.

Preferably, the second active layer and the third active layer are arranged at a same layer and prepared from a same material.

Preferably, a drain of the switching thin film field-effect transistor contacts the first active layer and the third active layer respectively, and a source thereof contacts the first active layer and the third active layer respectively.

According to another aspect of the present disclosure, a method for manufacturing an organic light-emitting display device is provided. The method includes steps of:

providing a substrate;

forming a first patterned metal layer on the substrate, wherein the patterned metal layer comprises a gate of a switching thin film field-effect transistor and a gate of a driving thin film field-effect transistor;

forming a gate insulating layer having a first via hole on the first patterned metal layer;

forming a first indium-gallium-zinc oxide layer on the gate insulating layer, wherein the first indium-gallium-zinc oxide layer comprises a first active layer for reducing a sub-threshold swing of a transfer characteristic curve of the switching thin film field-effect transistor;

forming a second indium-gallium-zinc oxide layer on the first active layer, wherein the second indium-gallium-zinc oxide layer comprises a third active layer and a second active layer for increasing a sub-threshold swing of a transfer characteristic curve of the driving thin film field-effect transistor;

forming a second patterned metal layer on the second indium-gallium-zinc oxide layer, wherein the second patterned metal layer comprises a source and a drain of the switching thin film field-effect transistor and a source and a drain of the driving thin film field-effect transistor, and the source of the switching thin film field-effect transistor is connected with the gate of the driving thin film field-effect transistor through the first via hole;

forming a passivation layer having a second via hole on the second patterned metal layer; and forming a third metal layer on the passivation layer, wherein the third metal layer comprises a pixel electrode connecting with the source of the driving thin film field-effect transistor through the second via hole.

Preferably, an oxygen content of the second indium-gallium-zinc oxide layer is greater than that of the first indium-gallium-zinc oxide layer.

Preferably, the manufacturing method further comprises steps of: regulating texture of the second indium-gallium-zinc oxide layer through physical vapor deposition, and/or increasing the oxygen content of the second indium-gallium-zinc oxide layer by adjusting the interfaces of the second indium-gallium-zinc oxide layer and the gate insulating layer.

Preferably, the drain of the switching thin film field-effect transistor contacts the first active layer and the third active layer respectively, and the source thereof contacts the first active layer and the third active layer respectively.

In the organic light-emitting display of the present disclosure, the transfer characteristic curve of the switching thin film field-effect transistor has a small sub-threshold swing in presence of the first active layer, and the transfer characteristic curve of the driving thin film field-effect transistor has a large sub-threshold swing in presence of the second active layer. In this way, the present disclosure can achieve quick switching on/off of the switching thin film field-effect transistor and slow regulation of the gray scale of OLED of the driving thin film field-effect transistor at the same time.

The present disclosure is applicable to organic light-emitting display.

Other features and advantages of the present disclosure will be further explained in the following description, and will partly become self-evident therefrom, or be understood through the implementation of the present disclosure. The objectives and advantages of the present disclosure will be achieved through the structures specifically pointed out in the description, claims, and the accompanying drawings.

BRIEF DESCRIPTION OF THE DRAWINGS

The accompanying drawings are provided for a further understanding of the present disclosure, and constitute a part of the description. The drawings, together with the embodiments of the present disclosure, are for illustrating, rather than limiting the present disclosure.

FIGS. 4-9 each schematically show a structure of the organic light-emitting display device of the embodiments of the present disclosure in all stages of the manufacturing process thereof;

In the Figures, identical components are represented by identical reference characters; and the Figures are not drawn to scale.

DETAILED DESCRIPTION OF THE EMBODIMENTS

The present disclosure will be further explained in detail connection with the accompanying drawings.

In the prior art, sub-threshold swings of transfer characteristic curves of a switching thin film field-effect transistor and a driving thin film field-effect transistor of an active matrix organic light-emitting diode (AMOLED) are almost the same, which enables it impossible for the AMOLED to have both functions of switching on/off the switching thin film field-effect transistor rapidly and regulating a gray scale of the OLED slowly through the driving thin film field-effect transistor. Directed against the above technical effect, embodiments of the present disclosure provide an organic light-emitting display device.

Embodiment 1

Figure 1:
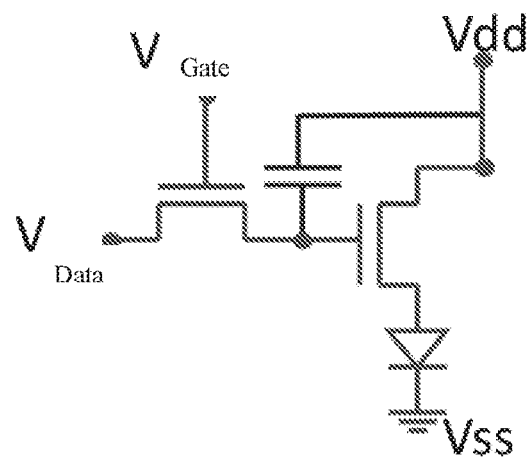
FIG. 1 schematically shows a circuit diagram of a 2T1C structure in the prior art.
Figure 2:
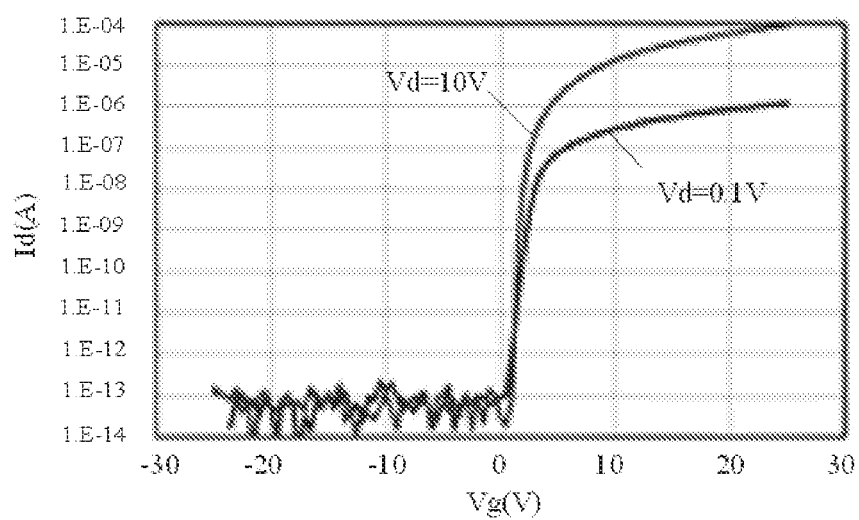
FIG. 2 schematically shows a diagram of a transfer characteristic c or a switching thin film field-effect transistor in the prior art.
Figure 3:
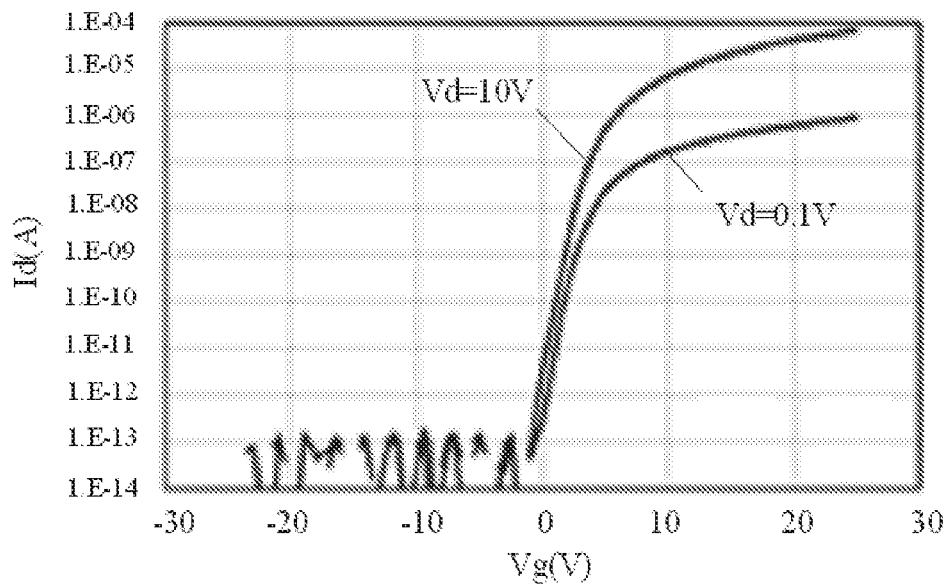
FIG. 3 schematically shows a diagram of a transfer characteristic curve of a driving thin film field-effect transistor in the prior art.
Figure 4:
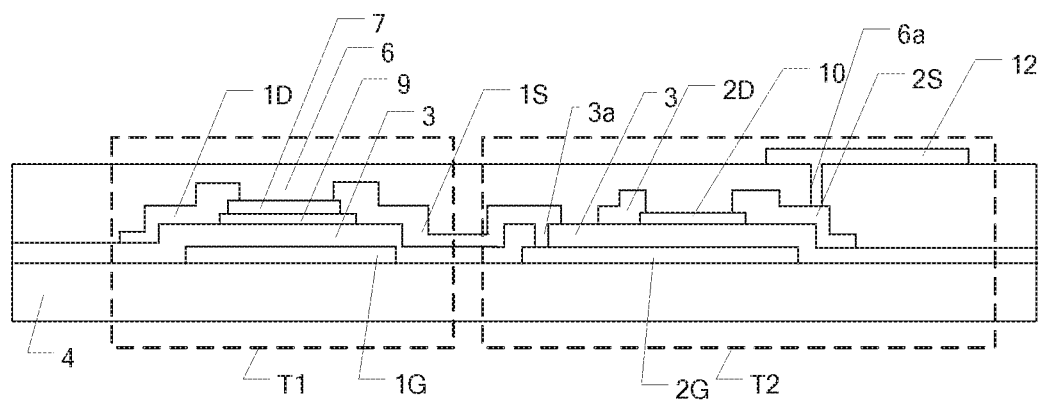
FIG. 4 schematically shows a profile diagram of an organic light-emitting display device in an embodiment of the present disclosure.
Figure 5:
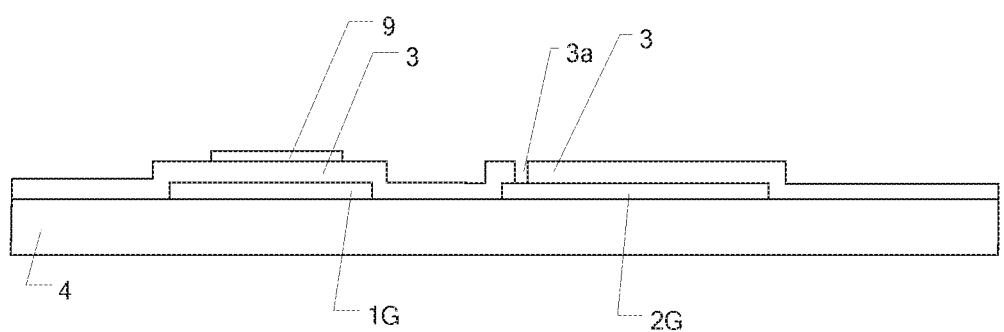

FIG. 4 schematically shows a profile diagram of an organic light-emitting display device of the present embodiment of the present disclosure. As shown in FIG. 4, the organic light-emitting display device of the embodiment comprises a switching thin film field-effect transistor T1, a driving thin film field-effect transistor T2, and a storage capacitor connecting with the switching thin film field-effect transistor T1 and the driving thin film field-effect transistor T2 respectively.

Specifically, the switching thin film field-effect transistor T1 comprises a first active layer 9 for reducing a sub-threshold swing of a transfer characteristic curve of the switching thin film field-effect transistor T1; and the driving thin film field-effect transistor T2 comprises a second active layer 10 for increasing the sub-threshold swing of the transfer characteristic curve of the driving thin film field-effect transistor T2.

The transfer characteristic curve of the switching thin film field-effect transistor T1 has a small sub-threshold swing in presence of the first active layer 9, and therefore the switching thin film field-effect transistor T1 can be switched on/off rapidly. Further, the transfer characteristic curve of the driving thin film field-effect transistor T2 has a great sub-threshold swing in presence of the second active layer 10, which can facilitate slow regulation of a gray scale of an OLED of the driving thin film field-effect transistor T2.

It can be known from the above that, in the embodiment, by arranging the first active layer 9 and the second active layer 10, the organic light-emitting display device can not only switch on/off the switching thin film field-effect transistor T1 rapidly, but also regulate the gray scale of the OLED slowly through the driving thin film field-effect transistor T2.

Embodiment 2

The organic light-emitting display device of the present embodiment comprises a switching thin film field-effect transistor T1, a driving thin film field-effect transistor T2, and a storage capacitor connecting with the switching thin film field-effect transistor T1 and the driving thin film field-effect transistor T2 respectively.

Specifically, the switching thin film field-effect transistor T1 comprises a first active layer 9 for reducing a sub-threshold swing of a transfer characteristic curve of the switching thin film field-effect transistor T1; and the driving thin film field-effect transistor T2 comprises a second active layer 10 for increasing a sub-threshold swing of a transfer characteristic curve of the driving thin film field-effect transistor T2.

Compared with embodiment 1, the present embodiment is different in that an oxygen content of the second active layer 10 of the organic light-emitting display device is greater than that of the first active layer 9. A sub-threshold swing of the transfer characteristic curve of the switching thin film field-effect transistor T1 is determined by the oxygen content of the first active layer 9, and the sub-threshold swing of the transfer characteristic curve of the driving thin film field-effect transistor T2 is determined by the oxygen content of the second active layer 10. By setting the oxygen content of the first active layer 9 to be less than that of the second active layer 10, the sub-threshold swing of the transfer characteristic curve of the switching thin film field-effect transistor T1 is smaller than that of the driving thin film field-effect transistor T2.

The embodiment adjusts the sub-threshold swings of the transfer characteristic curves of the thin film field-effect transistors by changing the oxygen contents of the active layers, which is simple and convenient to implement.

Embodiment 3

An organic light-emitting display device of the present embodiment comprises a switching thin film field-effect transistor T1, a driving thin film field-effect transistor T2, and a storage capacitor connecting with the switching thin film field-effect transistor T1 and the driving thin film field-effect transistor T2 respectively.

Specifically, the switching thin film field-effect transistor T1 comprises a first active layer 9 for reducing a sub-threshold swing of a transfer characteristic curve of the switching thin film field-effect transistor T1; and the driving thin film field-effect transistor 12 comprises a second active layer 10 for increasing a sub-threshold swing of a transfer characteristic curve of the driving thin film field-effect transistor T2. An oxygen content of the second active layer 10 is greater than that of the first active layer 9.

Compared with the embodiment 2, the present embodiment is different in that the first active layer 9 and the second active layer 10 of the organic light-emitting display device of the present embodiment are indium-gallium-zinc oxide layers.

An active layer is required to be formed of a material with high mobility. However, traditional amorphous-silicon film transistors and organic film transistors cannot meet the requirements in this respect any longer. The mobility of indium-gallium-zinc oxide can reach 80 cm2/Vs (while the mobility of amorphous silicon is merely 0.5~0.8 cm2/Vs). It can thus be seen that indium-gallium-zinc oxide has high mobility and good uniformity. Moreover, the procedure of manufacturing indium-gallium-zinc oxide is compatible with the procedure of manufacturing amorphous silicon. Therefore, an indium-gallium-zinc oxide layer is especially suitable for application as an active layer.

Embodiment 4

An organic light-emitting display device of the present embodiment comprises a switching thin film field-effect transistor T1, a driving thin film field-effect transistor T2, and a storage capacitor connecting with the switching thin film field-effect transistor T1 and the driving thin film field-effect transistor T2 respectively.

Specifically, the switching thin film field-effect transistor T1 comprises a first active layer 9 for reducing a sub-threshold swing of a transfer characteristic curve of the switching thin film field-effect transistor T1; and the driving thin film field-effect transistor T2 comprises a second active layer 10 for increasing a sub-threshold swing of a transfer characteristic curve of the driving thin film field-effect transistor T2.

Compared with the embodiment 1, the present embodiment is different in that the switching thin film transistor of the present embodiment further comprises a third active layer 7 formed on the first active layer 9.

Specifically, the third active layer 7 is arranged right on the first active layer 9 to protect the first active layer 9. Moreover, it can be seen that the third active layer 7 has a function of protecting a back channel.

In the present embodiment, the first active layer 9 is provided thereon with the third active layer 7, which is useful for improving the reliability of the switching thin film field-effect transistor T1.

Embodiment 5

An organic light-emitting display device of the present embodiment comprises a switching thin film field-effect transistor T1, a driving thin film field-effect transistor T2, and a storage capacitor connecting with the switching thin film field-effect transistor T1 and the driving thin film field-effect transistor T2 respectively.

Specifically, the switching thin film field-effect transistor T1 comprises a first active layer 9 for reducing a sub-threshold swing of a transfer characteristic curve of the switching thin film field-effect transistor T1; and the driving thin film field-effect transistor T2 comprises a second active layer 10 for increasing a sub-threshold swing of a transfer characteristic curve of the driving thin film field-effect transistor T2. Moreover, the switching thin film field-effect transistor T1 further comprises a third active layer 7 formed on the first active layer 9.

Compared with the embodiment 4, the present embodiment is different in that the second active layer 10 and the third active layer 7 are arranged on a same layer and are prepared from a same material.

In the present embodiment, the transfer characteristic curve of the switching thin film field-effect transistor T1 is determined by the first active layer 9. The sub-threshold swing of the transfer characteristic curve of the switching thin film field-effect transistor T1 could not be affected by the third active layer 7. The second active layer 10 and the third active layer 7 are arranged on the same layer and prepared from the same material. In this manner, the second active layer 10 and the third active layer 7 can be prepared in one manufacturing process. It can be seen that this embodiment can simplify the manufacturing process of the organic light-emitting display device, and the performance and the yield of the organic light-emitting display device are improved to a certain degree.

Embodiment 6

An organic light-emitting display device of the present embodiment comprises a switching thin film field-effect transistor T1, a driving thin film field-effect transistor T2, and a storage capacitor connecting with the switching thin film field-effect transistor T1 and the driving thin film field-effect transistor T2 respectively.

Specifically, the switching thin film field-effect transistor T1 comprises a first active layer 9 for reducing a sub-threshold swing of a transfer characteristic curve of the switching thin film field-effect transistor T1; and the driving thin film field-effect transistor T2 comprises a second active layer 10 for increasing the sub-threshold swing of a transfer characteristic curve of the driving thin film field-effect transistor T2.

In the present embodiment, a drain of the switching thin film field-effect transistor T1 contacts the first active layer 9 and the third active layer 7, respectively, and a source thereof contacts the first active layer 9 and the third active layer 7, respectively.

In the present embodiment, the drain of the switching thin film field-effect transistor T1 contacts the first active layer 9 and the third active layer 7 respectively, and the source thereof directly contacts the first active layer 9 and the third active layer 7 respectively. In this way, a nice ohmic contact is formed between the drain of the switching thin film field-effect transistor T1 and the first active layer 9 and the third active layer 7, and a nice ohmic contact is formed between the source of the switching thin film field-effect transistor T1 and the first active layer 9 and the third active layer 7. It can be seen that this embodiment is useful for improving stability of the organic light-emitting display device, and the performance and the yield of the organic light-emitting display device are improved to a certain degree.

Embodiment 7

Figure 8:
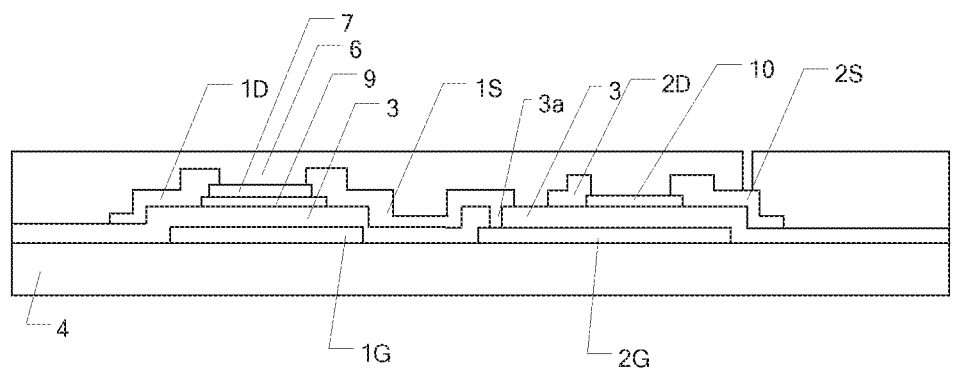
Figure 9:
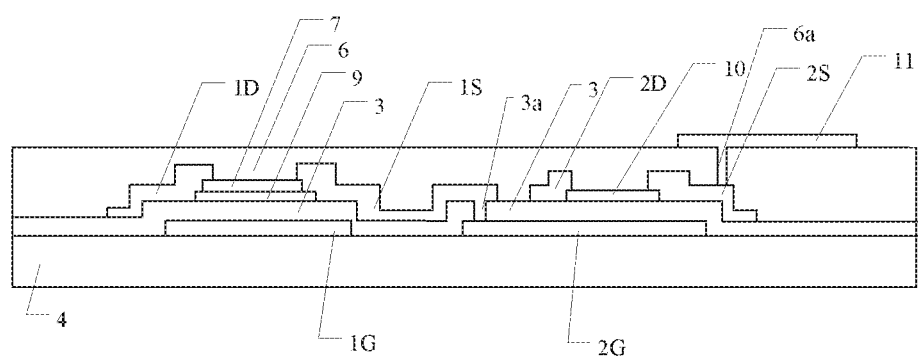
Figure 10:
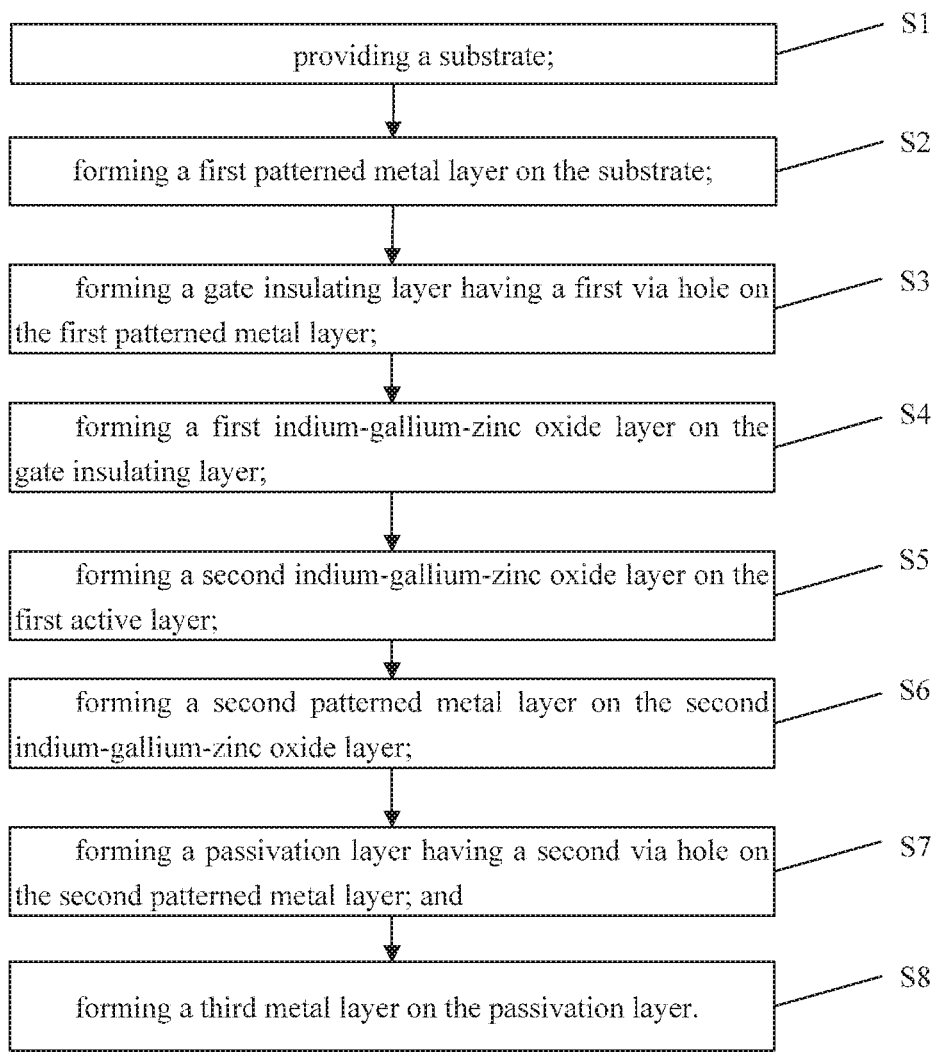
FIG. 10 shows a flow chart of a manufacturing method of the organic light-emitting display device in an embodiment of the presence disclosure.

The present embodiment will be explained in detail in connection with the accompanying FIGS. 5-10. FIGS. 5-9 each schematically show a structure of an organic light-emitting display device of the present embodiment in all stages of the manufacturing process thereof. FIG. 10 is a flow chart of a method for manufacturing the organic light-emitting display device of the present embodiment.

The method for manufacturing the organic light-emitting display device of the embodiment mainly includes the following steps S1-S8.

In Step S1, a substrate 4 is provided.

In Step S2, a first patterned metal layer is formed on the substrate 4. The patterned metal layer comprises a gate 1G of a switching thin film field-effect transistor T1 and a gate 2G of the driving thin film field-effect transistor T2.

In Step S3, a gate insulating layer 3 having a first via hole 3a is formed on the first patterned metal layer.

In Step S4, a first indium-gallium-zinc oxide layer is formed on the gate insulating layer 3 by physical vapor deposition (PVD), exposure, etching and other processes. The first indium-gallium-zinc oxide layer comprises a first active layer 9 for reducing a sub-threshold swing of a transfer characteristic curve of the switching thin film field-effect transistor T1.

Figure 6:
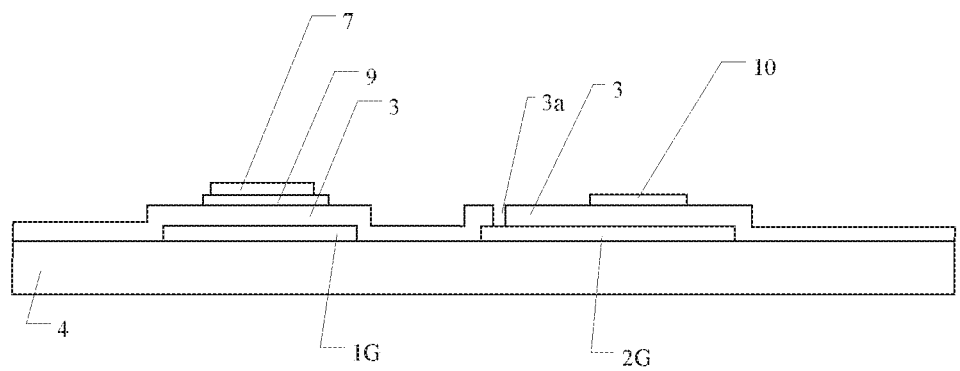

In Step S5, a second indium-gallium-zinc oxide layer is formed on the first active layer 9 sequentially by PVD, exposure, etching and other processes. The second indium-gallium-zinc oxide layer comprises a third active layer 7 and a second active layer 10 for increasing a sub-threshold swing of a transfer characteristic curve of the driving thin film field-effect transistor T2. The structure formed after step S5 is shown in FIG. 6.

Figure 7:
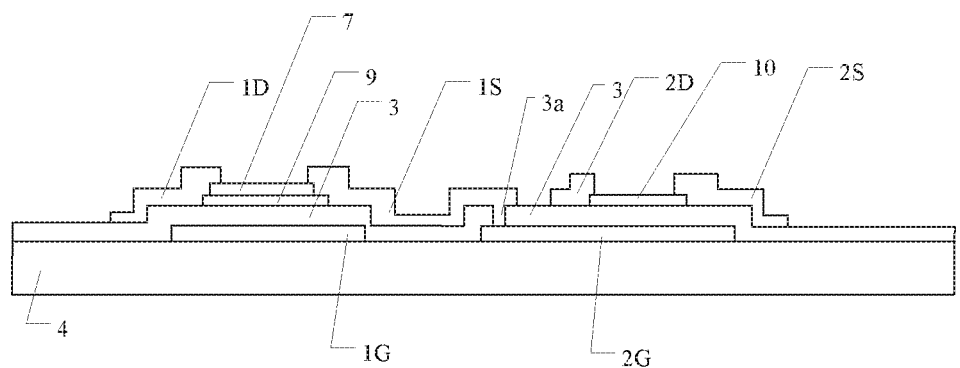

In Step 6, a second patterned metal layer is formed on the second indium-gallium-zinc oxide layer by chemical vapor deposition (CVD), exposure, dry etching and other processes. The second patterned metal layer comprises a source 1S and a drain 1D of the switching thin film field-effect transistor T1 and a source 2S and a drain 2D of the driving thin film field-effect transistor T2. The source 1S of the switching thin film field-effect transistor T1 is connected with the gate 2G of the driving thin film field-effect transistor T2 through the first via hole 3a. The structure formed after step S6 is shown in FIG. 7.

In Step S7, a passivation layer 6 having a second via hole 6a is formed on the second patterned metal layer. The structure formed after the step S7 is shown in FIG. 8.

In Step S8, a third metal layer is formed on the passivation layer 6 by PVD, exposure, etching and other processes. The third metal layer comprises a pixel electrode 12 connecting with the source 2S of the driving thin film field-effect transistor T2 through the second via hole 6a. The structure formed after the step S8 is shown in FIG. 9.

The transfer characteristic curve of the switching thin film field-effect transistor T1 has a small sub-threshold swing in presence of the first active layer 9, so that the switching thin film field-effect transistor T1 can be switched on/off rapidly. The transfer characteristic curve of the driving thin film field-effect transistor T2 has a large sub-threshold swing in presence of the second active layer 10, which it is useful for slowly regulating the gray scale of an OLED of the driving thin film field-effect transistor T2.

It can be known from the above that, in the present embodiment, by arranging the first active layer 9 and the second active layer 10, the organic light-emitting display device can not only switch on/off the switching thin film field-effect transistor T1 rapidly, but also regulate the gray scale of the OLED slowly through the driving thin film field-effect transistor T2.

Embodiment 8

In Step S5, the second indium-gallium-zinc oxide layer is formed on the first active layer 9. The second indium-gallium-zinc oxide layer comprises the third active layer 7 and the second active layer 10 for increasing the sub-threshold swing of the transfer characteristic curve of the driving thin film field-effect transistor T2.

During the process, the oxygen content of the second indium-gallium-zinc oxide layer is set to be greater than that of the first indium-gallium-zinc oxide layer. That is, the oxygen content of the second active layer 10 is greater than that of the first active layer 9.

In the present embodiment, the oxygen content of the second active layer 10 of the organic light-emitting display device is greater than that of the first active layer 9. The sub-threshold swing of the transfer characteristic curve of the switching thin film field-effect transistor T1 is determined by the oxygen content of the first active layer 9, and the sub-threshold swing of the transfer characteristic curve of the driving thin film field-effect transistor 12 is determined by the oxygen content of the second active layer 10. Moreover, the sub-threshold swing of the transfer characteristic curve of the switching thin film field-effect transistor T1 can be less than that of the driving thin film field-effect transistor T2 by setting the oxygen content of the first active layer 9 to be less than that of the second active layer.

The embodiment adjusts the sub-threshold swing of the transfer characteristic curve of the thin film field-effect transistor by changing the oxygen content of the active layer in the, which is simple and convenient to implement.

Embodiment 9

In Step S5, the second indium-gallium-zinc oxide layer is formed on the first active layer 9. The second indium-gallium-zinc oxide layer comprises the third active layer 7 and the second active layer 10 for increasing the sub-threshold swing of the transfer characteristic curve of the driving thin film field-effect transistor T2. During the process, the oxygen content of the second indium-gallium-zinc oxide layer to be greater than that of the first indium-gallium-zinc oxide layer.

Further, in the present embodiment, texture of the second indium-gallium-zinc oxide layer is adjusted by physical vapor deposition, and/or the oxygen contents of the second indium-gallium-zinc oxide layer is increased by adjusting an interface of the second indium-gallium-zinc oxide layer and the gate insulating layer.

The oxygen content of the indium-gallium-zinc oxide layer is increased by PVD, and the indium-gallium-zinc oxide layer with high oxygen content is acquired by adjusting a ratio of Ar/O during the film forming process, the above method enables the oxygen content of the second indium-gallium-zinc oxide layer to be greater than that of the first indium-gallium-zinc oxide layer, thereby rendering the sub-threshold swing of the transfer characteristic curve of the second indium-gallium-zinc oxide layer greater than that of the first indium-gallium-zinc oxide layer. In particular, in a preferable embodiment of the present disclosure, the oxygen content of the second active layer 10 can be further improved by regulating the experimental manufacturing process, this is more useful for increasing the sub-threshold swing of the transfer characteristic curve of the driving thin film field-effect transistor T2.

Embodiment 10

In Step S6, the second patterned metal layer is formed on the second indium-gallium-zinc oxide layer by chemical vapor deposition (CVD), exposure, dry etching and other processes. The second patterned metal layer comprises a source 1S and a drain 1D of the switching thin film field-effect transistor T1 and a source 2S and a drain 2D of the driving thin film field-effect transistor T2. The source 1S of the switching thin film field-effect transistor T1 is connected with the gate 2G of the driving thin film field-effect transistor T2 through the first via hole 3a.

During this process, the drain 1D of the switching thin film field-effect transistor T1 contacts the first active layer and the third active layer 7, respectively, and the source 1S thereof contacts the first active layer 9 and the third active layer 7, respectively.

In the present embodiment, the drain 1D of the switching thin film field-effect transistor T1 contacts the first active layer 9 and the third active layer 7, respectively, and the source 1S thereof directly contacts the first active layer 9 and the third active layer 7, respectively. In this way, a nice ohmic contact is formed between the drain 1D of the switching thin film field-effect transistor T1 and the first active layer 9 and the third active layer 7, and a nice ohmic contact is formed between the source 1S of the switching thin film field-effect transistor T1 and the first active layer 9 and the third active layer 7. It can be seen that the embodiment is useful for improving the stability of the organic light-emitting display device, and the performance of the yield of the organic light-emitting display device are improved to a certain degree.

For those skilled in the art, the present disclosure is apparently not limited to the details of the above-mentioned demonstrative embodiments, and can be implemented in other specific forms without departing from the spirits or basic features of the present disclosure. Therefore, the embodiments shall be considered demonstrative and non-restrictive. The scope of the present disclosure shall be subject to the claims attached rather than the above-mentioned description. All changes failing within the meaning and scope of equivalent elements of the claims shall be included in the present disclosure.

The present disclosure is described above with reference to specific embodiments, but it should be noted that these embodiments are merely exemplary of the principles and applications of the present disclosure. It should therefore be understood that the exemplary embodiments can be amended in various ways and other designs can also be provided without departure from the spirit and scope of the present disclosure. One should also understand that different features in the dependent claims and the description can be combined in ways different from those described in the original claims, and that a combination of features in one embodiment can be used in other embodiments.

The invention claimed is:

1. A method for manufacturing an organic light-emitting display device, comprising steps of:
    providing a substrate;
    forming a first patterned metal layer on the substrate, wherein the patterned metal layer comprises a gate of a switching thin film field-effect transistor and a gate of a driving thin film field-effect transistor;
    forming a gate insulating layer having a first via hole on the first patterned metal layer;
    forming a first indium-gallium-zinc oxide layer on the gate insulating layer, wherein the first indium-gallium-zinc oxide layer comprises a first active layer for reducing a sub-threshold swing of a transfer characteristic curve of the switching thin film field-effect transistor;
    forming a second indium-gallium-zinc oxide layer on the first active layer and the gate insulating layer, wherein the second indium-gallium-zinc oxide layer comprises a third active layer and a second active layer for increasing a sub-threshold swing of a transfer characteristic curve of the driving thin film field-effect transistor;
    forming a second patterned metal layer on the second indium-gallium-zinc oxide layer, wherein the second patterned metal layer comprises a source and a drain of the switching thin film field-effect transistor and a source and a drain of the driving thin film field-effect transistor, and the source of the switching thin film field-effect transistor is connected with the gate of the driving thin film field-effect transistor through the first via hole;
    forming a passivation layer having a second via hole on the second patterned metal layer; and forming a third metal layer on the passivation layer, wherein the third metal layer comprises a pixel electrode connecting with the source of the driving thin film field-effect transistor through the second via hole,
    wherein an oxygen content of the second indium-gallium-zinc oxide layer is greater than that of the first indium-gallium-zinc oxide layer.

2. The method according to claim 1, wherein the drain of the switching thin film field-effect transistor contacts the first active layer and the third active layer, respectively, and the source thereof contacts the first active layer and the third active layer, respectively.

3. The method according to claim 1, wherein the drain of the switching thin film field-effect transistor contacts the first active layer and the third active layer, respectively, and the source thereof contacts the first active layer and the third active layer, respectively.

4. The method according to claim 1, wherein the method further comprises steps of: adjusting texture of the second indium-gallium-zinc oxide layer through physical vapor deposition, and/or increasing the oxygen content of the second indium-gallium-zinc oxide layer by adjusting an interface of the second indium-gallium-zinc oxide layer and the gate insulating layer.

5. The method according to claim 4, wherein the drain of the switching thin film field-effect transistor contacts the first active layer and the third active layer, respectively, and the source thereof contacts the first active layer and the third active layer, respectively.

* * * * *